United States Patent
Campbell et al.

(10) Patent No.: US 7,105,864 B2
(45) Date of Patent: Sep. 12, 2006

(54) NON-VOLATILE ZERO FIELD SPLITTING RESONANCE MEMORY

(75) Inventors: Kristy A. Campbell, Boise, ID (US); Terry L. Gilton, Boise, ID (US); John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 244 days.

(21) Appl. No.: 10/765,911

(22) Filed: Jan. 29, 2004

(65) Prior Publication Data

US 2005/0167689 A1    Aug. 4, 2005

(51) Int. Cl.
*H01L 29/24* (2006.01)
(52) U.S. Cl. .................. 257/100; 257/100; 257/103
(58) Field of Classification Search ............... 257/100, 257/103, 42, E21.029
See application file for complete search history.

(56) References Cited

U.S. PATENT DOCUMENTS

| | | |
|---|---|---|
| 3,271,591 A | 9/1966 | Ovshinsky |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,809,044 A | 2/1989 | Pryor et al. |
| 4,818,717 A | 4/1989 | Johnson et al. |

(Continued)

OTHER PUBLICATIONS

A. E. Botha et al.; "Electron-spin polarization in symmetric type-II quantum wells from bulk inversion asymmetry" The American Physical Society, Physical Review B67, 195334 pp. 1-8 (2003).

(Continued)

*Primary Examiner*—David Nelms
*Assistant Examiner*—Thinh T Nguyen
(74) *Attorney, Agent, or Firm*—Dickstein Shapiro Morin & Oshinsky LLP

(57) ABSTRACT

A low-volatility or non-volatility memory device utilizing zero field splitting properties to store data. In response to an electrical pulse or a light pulse, in the absence of any externally applied magnetic field, the host material can switch between stable energy-absorbing states based on the zero field splitting properties of the metal ions and the surrounding host material. The invention also includes a device and method for the storage of multiple bits in a single cell using a plurality of metal ion species in a single host material.

77 Claims, 5 Drawing Sheets

U.S. PATENT DOCUMENTS

| | | | |
|---|---|---|---|
| 4,843,443 A | 6/1989 | Ovshinsky et al. | |
| 4,845,533 A | 7/1989 | Pryor et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,296,716 A | 3/1994 | Ovshinsky et al. | |
| 5,335,219 A | 8/1994 | Ovshinsky et al. | |
| 5,341,328 A | 8/1994 | Ovshinsky et al. | |
| 5,359,205 A | 10/1994 | Ovshinsky | |
| 5,406,509 A | 4/1995 | Ovshinsky et al. | |
| 5,414,271 A | 5/1995 | Ovshinsky et al. | |
| 5,530,263 A | 6/1996 | DiVincenzo | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,792,330 A | 8/1998 | Petersen et al. | |
| 5,825,046 A | 10/1998 | Czubatyj et al. | |
| 5,912,839 A | 6/1999 | Ovshinsky et al. | |
| 5,933,365 A | 8/1999 | Klersy et al. | |
| 6,011,757 A | 1/2000 | Ovshinsky | |
| 6,052,519 A | 4/2000 | Gates et al. | |
| 6,061,265 A | 5/2000 | Hannah | |
| 6,087,674 A | 7/2000 | Ovshinsky et al. | |
| 6,141,241 A | 10/2000 | Ovshinsky et al. | |
| 6,208,553 B1 | 3/2001 | Gryko et al. | |
| 6,212,093 B1 | 4/2001 | Lindsey | |
| 6,218,718 B1 | 4/2001 | Gregg et al. | |
| RE37,259 E | 7/2001 | Ovshinsky | |
| 6,272,038 B1 | 8/2001 | Clausen et al. | |
| 6,304,481 B1 | 10/2001 | Hurt | |
| 6,324,091 B1 | 11/2001 | Gryko et al. | |
| 6,325,914 B1 * | 12/2001 | Dediu et al. | 205/688 |
| 6,339,544 B1 | 1/2002 | Chiang et al. | |
| 6,381,169 B1 | 4/2002 | Bocian et al. | |
| 6,404,665 B1 | 6/2002 | Lowery et al. | |
| 6,429,064 B1 | 8/2002 | Wicker | |
| 6,437,383 B1 | 8/2002 | Xu | |
| 6,451,942 B1 | 9/2002 | Li et al. | |
| 6,462,984 B1 | 10/2002 | Xu et al. | |
| 6,480,438 B1 | 11/2002 | Park | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B1 | 1/2003 | Hudgens et al. | |
| 6,511,867 B1 | 1/2003 | Lowery et al. | |
| 6,512,241 B1 | 1/2003 | Lai | |
| 6,514,805 B1 | 2/2003 | Xu et al. | |
| 6,531,373 B1 | 3/2003 | Gill et al. | |
| 6,534,781 B1 | 3/2003 | Dennison | |
| 6,545,287 B1 | 4/2003 | Chiang | |
| 6,545,907 B1 | 4/2003 | Lowery et al. | |
| 6,555,860 B1 | 4/2003 | Lowery et al. | |
| 6,563,164 B1 | 5/2003 | Lowery et al. | |
| 6,566,700 B1 | 5/2003 | Xu | |
| 6,567,293 B1 | 5/2003 | Lowery et al. | |
| 6,569,705 B1 | 5/2003 | Chiang et al. | |
| 6,570,784 B1 | 5/2003 | Lowery | |
| 6,576,921 B1 | 6/2003 | Lowery | |
| 6,586,761 B1 | 7/2003 | Lowery | |
| 6,589,714 B1 | 7/2003 | Maimon et al. | |
| 6,590,807 B1 | 7/2003 | Lowery | |
| 6,593,176 B1 | 7/2003 | Dennison | |
| 6,597,009 B1 | 7/2003 | Wicker | |
| 6,605,527 B1 | 8/2003 | Dennison et al. | |
| 6,613,604 B1 | 9/2003 | Maimon et al. | |
| 6,621,095 B1 | 9/2003 | Chiang et al. | |
| 6,625,054 B1 | 9/2003 | Lowery et al. | |
| 6,642,102 B1 | 11/2003 | Xu | |
| 6,646,297 B1 | 11/2003 | Dennison | |
| 6,649,928 B1 | 11/2003 | Dennison | |
| 6,667,900 B1 | 12/2003 | Lowery et al. | |
| 6,671,710 B1 | 12/2003 | Ovshinsky et al. | |
| 6,673,648 B1 | 1/2004 | Lowrey | |
| 6,673,700 B1 | 1/2004 | Dennison et al. | |
| 6,674,115 B1 | 1/2004 | Hudgens et al. | |
| 6,687,153 B1 | 2/2004 | Lowery | |
| 6,687,427 B1 | 2/2004 | Ramalingam et al. | |
| 6,690,026 B1 | 2/2004 | Peterson | |
| 6,696,355 B1 | 2/2004 | Dennison | |
| 6,707,712 B1 | 3/2004 | Lowery | |
| 6,714,954 B1 | 3/2004 | Ovshinsky et al. | |
| 2003/0048744 A1 | 3/2003 | Ovshinsky et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

OTHER PUBLICATIONS

Kristy A. Campbell, et al.; "Parallel Polarization EPR Characterization of the Mn(III) Center of Oxidized Manganese Superoxide Dismutase" J. Am. Chem. Soc., 121, pp. 4714-4715 (1999).

Shunichi Fukuzumi, et al.; "Photochemical and Electrochemical Properties of Zinc Chlorin—$C_{60}$ Dyad as Compared to Corresponding Free-Base Chlorin—$C_{60}$, Free-Base Porphyrin—$C_{60}$, and Zinc Porphyrin—$C_{60}$, Dyads" J. Am. Chem. Soc., 123, pp. 10676-10683, (2001).

L. B. Glebov, et al.; "Magneto-induced microwave conductivity in $Mn^{2+}$—doped silicate glass" Journal of Non-Crystalline Solids 265, pp. 181-184, (2000).

O. Kahn, et al.; "Spin-Transition Polymers: From Molecular Materials Toward Memory Devices", Science, vol. 279, pp. 44-48 (Jan. 2, 1998).

Fatih Kocer, et al.; "A New Approach In NanoScale Electronics: Spin-FET (Field Effect Transistor) and Spin-Based Memory Architectures," <www.personal.engine.unich.edu/wpualized/spin.pdf> (accessed prior to Jan. 29, 2004).

Yuji Kubo, et al.; "Chirality-Transfer Control Using a Heterotopic Zinc (II) Porphyrin Dimer," J. Am. Chem. Soc. 123, pp. 12700-12701, (2001).

Physics Laboratory, "Fourier-Transform Microwave Spectroscopy for Chemical Analysis," <http://physics.nist.gov/Divisions/Div844/facilities/ftmw/ftmw.html> (accessed Feb. 24, 2003).

Qiliang Li; "Capacitance and conductance characterization of ferrocene-containing self-assembled monolayers on silicon surfaces for memory applications," Applied Physics Letters, vol. 81, No. 8, pp. 1494-1496, (Aug. 19, 2002).

Paul A. Liddell, et al.; "Photonic Switching of Photoinduced Electron Transfer in a Dithlenylethene-Porphyrin-fullerene Triad Molecule," J. Am. Chem. Soc. 124, pp. 7668-7669, (2002).

S.E. Lofland, et al.; "Giant microwave magneto-impedance in a single crystal of $La_{0.7}Sr_{0.3}$ $MnO_3$: The effect of ferromagnetic antiresonance," J. Appl. Phys. 80(6), pp. 3592-3594, (Sep. 15, 1996).

S. Ludwig, et al.; "Direct Coupling of Magnetic Fields to Tunneling Systems in Glasses," Physical Review Letters, vol. 88, No. 7, pp. 075501-1-4, (Feb. 18, 2002).

J.A. Majewski, et al.; "First principles study of spin-electronics: Zero-field spin-splitting in superlattices," <www.wsi.tu-muenchen.de/research/annual_reports/rep00/pdfs/24.pdf> (accessed prior to Jan. 29, 2004).

Ian J. McNaught, et al.; "Microwave Spectroscopy Tutor," <http://jchemed.chem.wisc.edu/JCESoft/Issues/Series_B/8B2/prog2-8B2.html> (accessed Feb. 24, 2003).

A.N. Medina, et al.; "Resonant microwave cavity response of amorphous ribbons," J. Appl. Phys. 79(8), pp. 5462-5464, (Apr. 15, 1996).

Ryo Miyamoto, et al.; "Interplanar interactions in the triplet dimmers of Zn and metal free complexes of crowned porphyrin and phthalocyanine studies by time-resolved electron paramagnetic resonance," Coordination Chemistry Reviews, 132, pp. 57-62, (1994).

P. Giri Prakash, et al.; "EPR and optical absorption studies of $Mn^{2+}$ ions in alkali borotellurite glasses," Modern Physics Letters B, vol. 16, Nos. 5 & 6, pp. 143-159, World Scientific Publishing Company, (2002).

R.R. Rakhimov, et al.; "Microwave response near zero magnetic field in transition-metal-doped silicate glasses," Applied Physics Letters, vol. 76, No. 6, pp. 751-753, (Feb. 7, 2000).

John Robblee; "Electron Paramagnetic Resonance" Berkeley Spectroscopy Club, <http://spectroscopy.161.gov/EPR-Robblee.pdf> (accessed Apr. 18, 2001).

M.A.Rowe, et al.; "A Hyperfine Measurement in Laser Trapped Radioactive $^{21}Na$," <http://weak0. physics.berkeley.edu/weakint/annual.reports/1997/21Na.NSD1997.pdf > (accessed prior to Jan. 29, 2004).

Pouya Valizadeh; "New Approaches in Spin-Electronics: High current gain spin-based HBT and Memory application for the spin-FET," III-V Integrated Circuits and Devices Group, Solid-State Electronics Laboratory, University of Michigan (pub. date not known).

Sung Ik Yang et al.; "Interplay of Orbital Tuning and Linker Location in Controlling Electronic Communication in Porphyrin Arrays," American Chemical Society, pp. 4008-4018, (1999).

Dae Hwan Yoon, et al.; "Electrical Conduction through Linear Porphyrin Arrays," J. Am. Chem. Soc. 125, pp. 11062-11064, (Aug. 15, 2003).

Chemedu, "Crystal Field Theory" <http://chemed.chem.purdue.edu/genchem/topicreview/bp/ch12/crystal.html>, (accessed Jun. 23, 2003).

U. Wimona, "Crystal Field Theory (CFT), An Introduction," <http://wwwchem.uwimona.edu.jm; 1104/courses/CFT.html> (accessed Jun. 23, 2003).

*BioChem, "Electromagnetic Radiation," <http://biochem.unl.edu/ragsdale/EPRspectroscopy/sld002.html> (accessed Jul. 3, 2003).

"ESR Spectroscopy", <http://www.mlib.cnr.it/marble/esr.html> (accessed Jul. 16, 2003).

Frontier Scientific, "Prophyrins," Frontier Scientific, <http://www.frontiersci.com/porphyrins.html> (accessed Nov. 15, 2003).

Net BioChem, "Porphyrins" HemeandIron, <http://www.porphyrin.net/Heme_iron/porphyrins/_porphymain.html> (accessed Nov. 15, 2003).

U. WA, "Section 4: Metal-Ligand Interactions and Reactions of Coordinated Ligands," <http://www.chem.uwa.edu.au/enrolled_students/2nd_year_Chem_Inorg_Section/sect4/sect.> (accessed Jun. 23, 2003).

Univ. Arizona, "Microwave Spectroscopy," <http://www.chem.arizona.edu/faculty/kuko/research/mwspec/spectra/spectra.htm> (accessed Feb. 24, 2003).

BioChem, "The Mineral Perovskite," <http://mineral.galleries.com/minerals/oxides/perovvski/perovski.htm> (accessed Nov. 15, 2003).

BioChem, "Spin-Spin Interaction," <http://biochem.unl.edu/ragsdale/EPRspectroscopy/sld032.html> (accessed Jul. 16, 2003).

U. Alabama, <http://bama.ua.edu/Kshaughn/ch609/notes/3-legal survey> (accessed prior to Jan. 29, 2004).

* cited by examiner

NON-VOLATILE ZERO FIELD SPLITTING RESONANCE MEMORY

The invention disclosed in this application is related to the invention disclosed by U.S. patent application Ser. No. 10/766,010, filed on Jan. 29, 2004, by Kristy A. Campbell and Terry L. Gilton. The entirety of this related application is hereby incorporated by reference herein in its entirety.

FIELD OF THE INVENTION

The invention relates to memory devices utilizing zero field splitting parameters and methods of making and using such memory devices.

BACKGROUND

Integrated circuit designers have always sought the ideal semiconductor memory: a device that is randomly accessible, can be written or read very quickly, is non-volatile, but indefinitely alterable, consumes little power, and is scalable. The search for such devices has led to investigations into atomic-level properties of materials for switching and memory applications.

Studies have been conducted into electron spin transistors and memory components. Even in the absence of a magnetic field, some metal ions exhibit splitting of the electron spin energy levels. This is referred to as zero field splitting. Zero field splitting is different from Zeeman splitting (i.e., separation of the electron spin energy levels in the presence of an externally applied magnetic field). The difference being that some molecules may exhibit splitting of the electron energy levels at zero externally applied magnetic field, due in part, to the natural crystal fields present around a metal ion (in the case of molecules with transition metal ions) or to spin-spin coupling within a molecule or between molecules. Molecules with transition metals (e.g., Mn, V, Fe, Co, Cr, Ni, Cu, Zn, Cd, and others) are quite frequently paramagnetic and may have electron spin energy levels at zero magnetic field with an energy splitting between levels for which a spin transition is allowed that is within a range detectable with microwave radiation. For example, as shown in FIG. 1, $Mn^{+3}$ ions have a spin system with an effective spin $S=2$, with a positive zero field splitting value. The inset portion of FIG. 1 is an expanded view of the $Ms=\pm2$ energy levels in the region of observed parallel mode electron paramagnetic resonance transitions (indicated by the double arrows). Analytical techniques, such as microwave spectroscopy or electron paramagnetic resonance (EPR) spectroscopy can identify molecular systems that exhibit zero field splitting properties.

Spin-spin interactions occur when there is at least one unpaired electron interacting with another unpaired electron (S greater than or equal to 1, where S is the effective spin). An example molecular system that could give rise to this situation includes a molecule containing $Mn^{+3}$, which has a total spin $S=2$ (e.g., the molecule Mn(salen)). In this case, there are 4 unpaired electrons interacting with each other.

Microwave absorption spectroscopy has been used to identify atomic properties of chemical species. Microwave absorption has been shown to be a viable means of determining energy absorption at frequencies corresponding to the zero field splitting value of the absorbing material.

It would be advantageous to utilize the zero field splitting properties of ions as a memory device. It would be additionally advantageous if such a memory device was non-volatile or semi-volatile, operated at speeds necessary for present memory functions, and could be scaled to submicron sizes.

SUMMARY

An exemplary embodiment of the invention provides a low-volatility or non-volatile memory cell utilizing the zero field splitting properties of a material to store data. The memory cell may incorporate at least one transition metal ion species. In response to an energy pulse, e.g., electrical or optical, the host material can switch between energy absorbing and non-energy absorbing (or less energy absorbing) states based on the zero field splitting properties of the material induced by the applied signal. Exemplary host material and metal ion combinations include chalcogenide glass with manganese ions, standard float glass (e.g., $Na_2O$-$CaO$-$MgO$-$SiO_2$) with ions (e.g., Mn ions), perovskite (e.g., $CaTiO_3$ and $MgSiO_3$) materials with manganese ions, porphyrins with manganese or zinc, or ferrocenes with ion species.

Another exemplary embodiment of the invention provides a memory cell, which can store multiple bits of data using a plurality of metal ion species in a single host material.

These and other features of exemplary embodiments of the invention will be more apparent from the following detailed description and drawings which illustrate the various embodiments.

DETAILED DESCRIPTION

Figure 1:
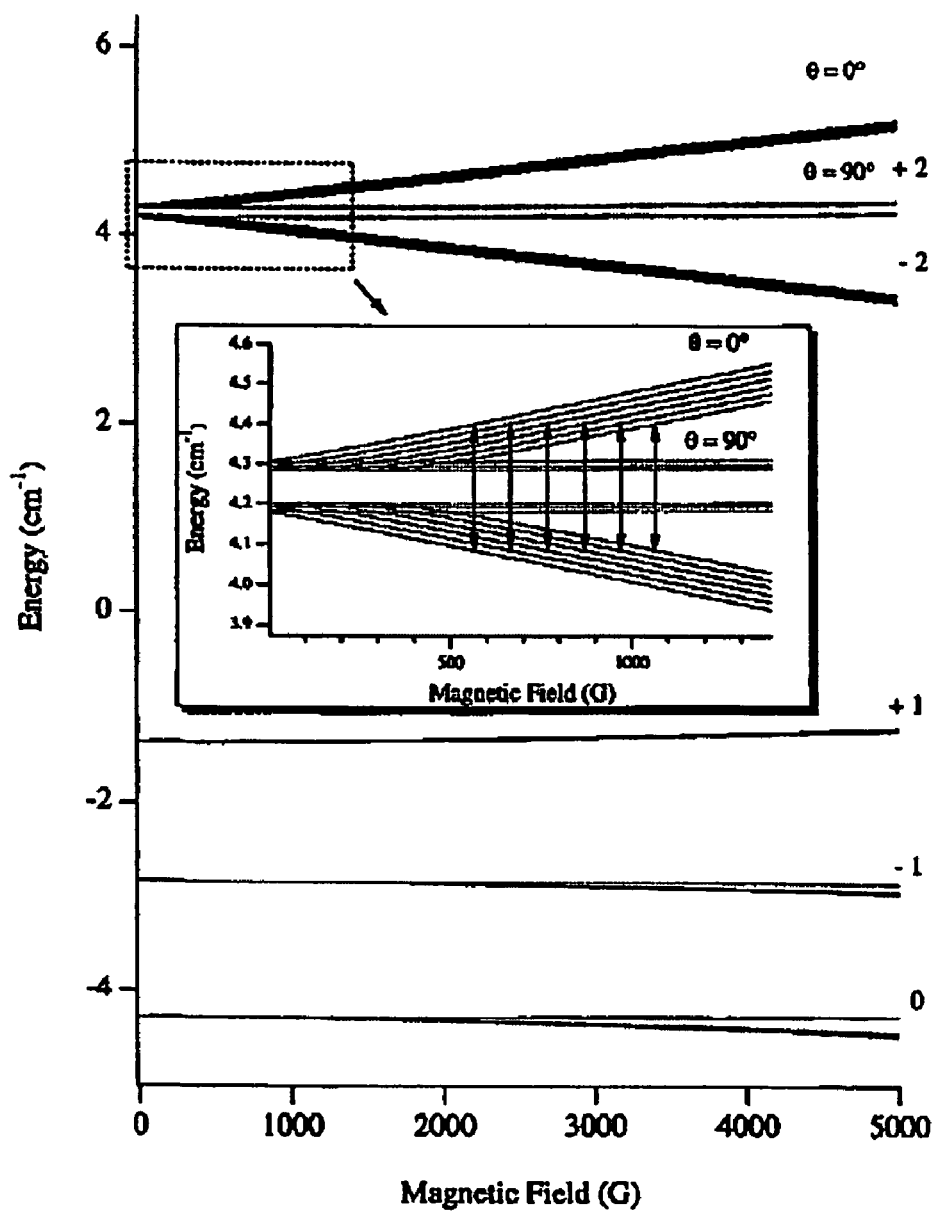
FIG. 1 is an energy level diagram of an $S=2$ system illustrating zero field splitting for a transition metal ion species.

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The terms "wafer" and "substrate" are to be understood as interchangeable and as including any foundation suitable for supporting a memory element of the invention. For example, the substrate can be silicon, silicon-on-insulator (SOI), silicon-on-sapphire (SOS), doped and undoped semiconductors, epitaxial layers of silicon supported by a base semiconductor foundation, and other semiconductor, conductor, or insulator structures. Furthermore, when reference is made to a "wafer" or "substrate" in the following description, previous process steps may have been utilized to form regions, junctions or material layers in or on the base structure or foundation. In addition, the semiconductor substrate need not be silicon-based, but could be based on silicon-germanium, germanium, gallium arsenide, or other known semiconductor materials. Further, the substrate need not be semiconductor-based at all, but can be any material suitable for supporting an integrated circuit memory structure, for instance, polymer, glass, metals, insulated metals, ceramics, and other materials.

The invention utilizes zero field splitting (ZFS) properties of certain metal ions to form a memory cell. Transition metal ions, such as ions of Co, Cr, Fe, Mn, Ti, Cu, Zn, V, Cd, and Ni, and others, are preferred and can be added to a host material, such as an organic molecular matrix or an inorganic matrix. The selection of the metal ions and the host material determines the zero field splitting energy; the host material may or may not play a role in the zero field splitting properties of the ions in memory operation. The selection of these ions and host materials should result in microwave absorption energies of about 0.03 $cm^{-1}$ to 3.3 $cm^{-1}$ at zero field to satisfy requirements for memory state sensing.

The separation of spin states in the metal ions within the host material at zero magnetic field should be be small enough to be able to utilize the energy available on a standard semiconductor chip. The host material, if organic, can be polymer based or porphyrin based. If the host material is inorganic, it may be a chalcogenide glass, e.g., arsenic selenide or germanium selenide, a semiconductor, or a silicate, for example.

Figure 2:
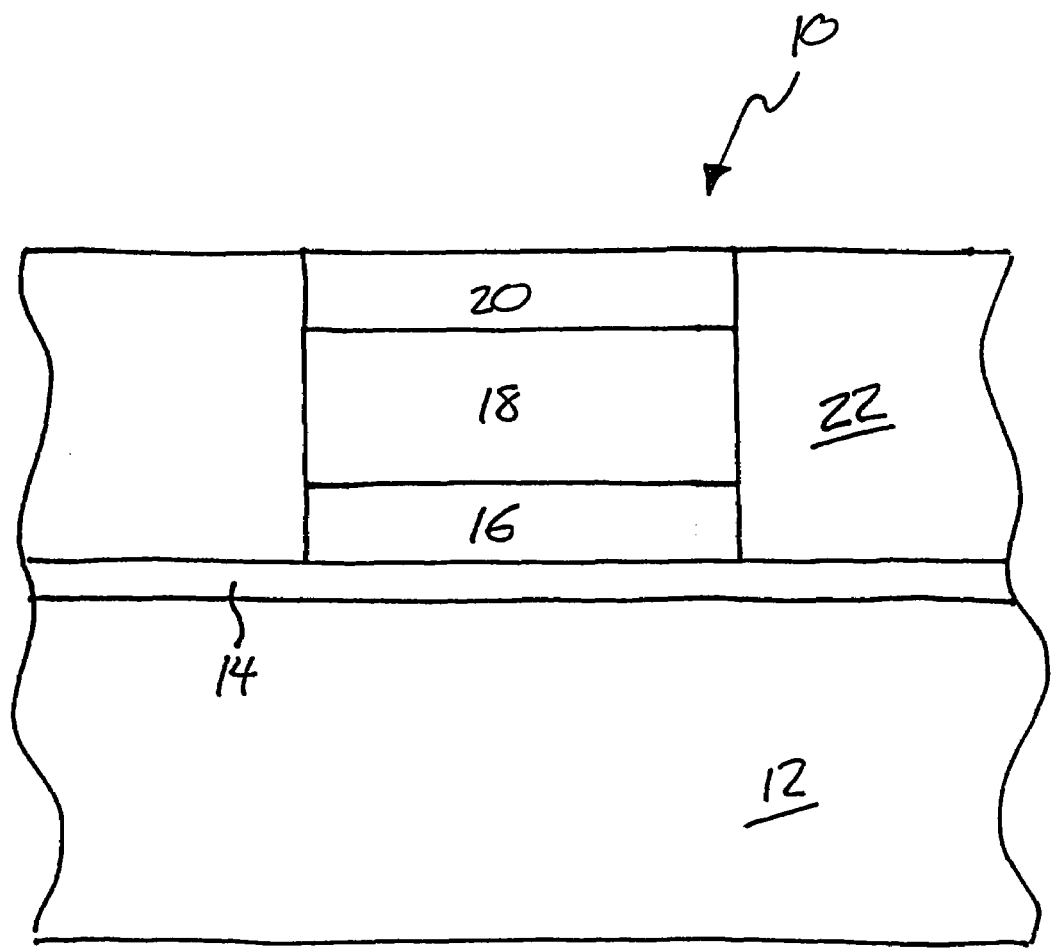
FIG. 2 is an illustration of a cross-section of a memory cell in accordance with an exemplary embodiment of the invention.

Now referring to the figures, where like reference numbers designate like elements, FIG. 2 shows a simplified illustration of a specific memory cell construction in accordance with an exemplary embodiment of the invention. The memory cell 10 is shown as supported by a substrate 12, which may be silicon-based, but as indicated above, the substrate can be any of a number of materials. The substrate 12 can be formed or provided as is known in the art by conventional means, depending on its composition.

An optional insulating layer 14 is provided over the substrate 12 if it is semiconductor-based. The optional insulating layer 14 can be, for example, silicon oxide or silicon nitride, and can be formed by CVD (chemical vapor deposition), sputtering, oxidation of the substrate 12, or other known techniques.

Over the optional insulating layer 14, or substrate 12 if that layer 14 is excluded, is provided an electrode 16 of a conductive material. The conductive material for the electrode 16 can be any of a number of materials, including, but not limited to, tungsten, tungsten nitride, aluminum, copper, doped polysilicon, nickel, titanium, and platinum. The electrode 16 material can be deposited by CVD, PECVD (plasma enhanced chemical vapor deposition), sputtering, plating, or other known techniques, and the electrode 16 can thereafter be defined by patterning and etching, if desired.

Over and electrically coupled to the electrode 18 is deposited a layer of host material 18, which incorporates metal ions, such as $Mn^{+2}$, for example. The host material 18 can be an organic or inorganic molecular matrix (as indicated above) and can be formed by blanket deposition techniques, which may be followed by patterning and etching if desired, or, alternatively, may be formed by an in-via process; either deposition process may include CVD, sputtering, co-sputtering, thermal evaporation, or other known techniques. The host material 18 can be about 100 Å to about 2,000 Å thick.

For example, one suitable and exemplary host material 18 is a $Ge_xSe_{100-x}$ glass, for example, a $Ge_{40}Se_{60}$ glass. Preferably, the glass and ions (e.g., $Mn^{+2}$ ions, which may be provided as MnSe) are deposited together by cosputtering or co-evaporation. In another method, the glass is first deposited, for example, by sputtering, and then a layer of ions is formed over the $Ge_{40}Se_{60}$ host material 18, for example, by sputtering or thermal evaporation. The ions can be incorporated into the host material 18 by photodoping or thermal diffusion, or by other means. If the host material 18 itself exhibits zero field splitting properties, the step of adding ions may be omitted.

Depending on the selection of host material 18 and metal ion pairing, the host material 18 can incorporate from less than about 0.3% to up to about 10% (by weight) metal ions. About 1 wt. % ion concentration is preferred.

A second electrode 20 is next deposited over the ion-doped host material 18. The second electrode 20 can be of the same or similar materials as the first electrode 16 and can be formed by the same or similar techniques. The memory device 10 stack can be surrounded by an insulating material 22, such as BPSG (borophosphosilicate glass) or polyimide, and the wafer can be planarized by CMP (chemical mechanical polishing) using the top electrode 20 as a stop, if desired. The memory device 10 shown in FIG. 2 is representative of one of a plurality of such devices that can be arranged in a memory array.

Figure 3:
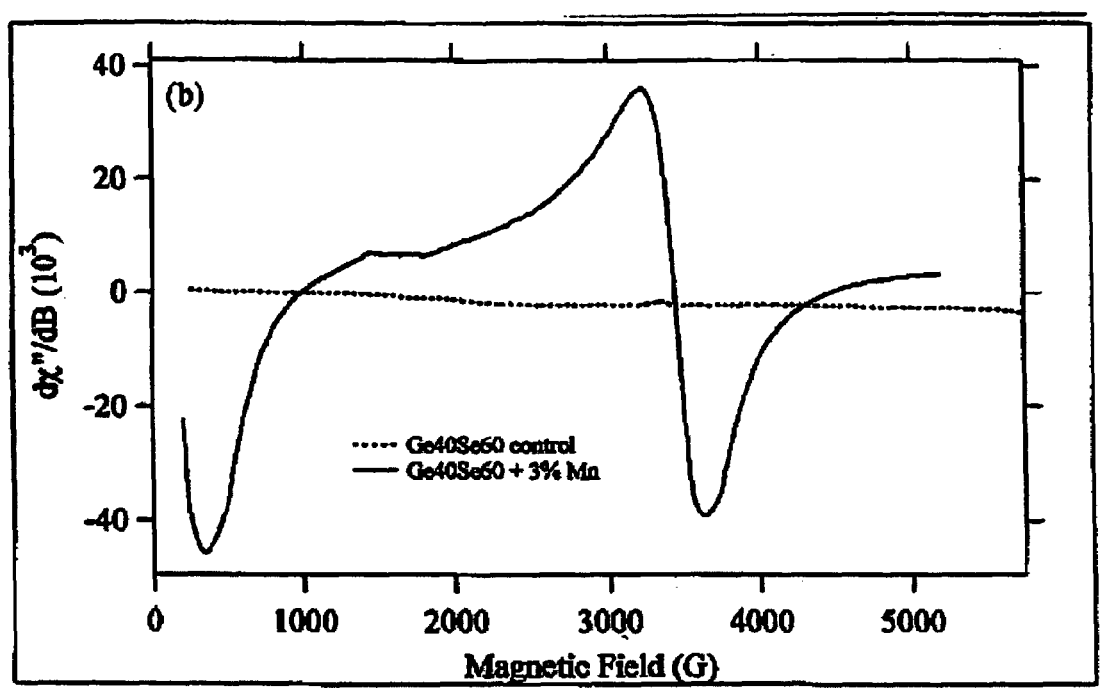
FIG. 3 is a graph showing the low field signal where zero field splitting may be observed in an exemplary embodiment of the invention.

The $Mn^{+2}$ ions in the above-described exemplary $Ge_{40}Se_{60}$ glass enable the host material 18 to display a relatively large microwave absorption at zero field, which enables the device to store data as energy absorption states. A memory device in accordance with this exemplary embodiment can absorb about 0.33 $cm^{-1}$ of energy of a potential pulse having a rise time of about 35 picoseconds and a frequency of about 9.68 GHz. As shown by the graph in FIG. 3, the zero field splitting absorption is observed at relatively low field signal in the structure of this embodiment. The germanium selenide stoichiometry plays a role in the functioning of this exemplary cell, with the $Ge_{40}Se_{60}$ glass being preferred over other germanium selenide stoichiometries. Other glass types and stoichiometries can be used in the invention, however.

In the embodiment discussed in the preceding paragraphs in relation to FIG. 2, the first electrode 16 can comprise manganese. The second electrode 20 can be tungsten. These electrodes 16 and 20 are not limited to such materials, however. Other conductive materials such as doped polysilicon, titanium, aluminum, copper, silver, platinum, nickel, and conductive nitrides can be used as well.

Other combinations of metal ions and host materials 18 can also be used for a memory device in accordance with the invention. As previously indicated, such combinations should be able to absorb a detectable amount of energy when in a programmed state. For example, a standard float glass doped with less than about 1% $Mn^{+2}$, $Mn^{+3}$, or $Fe^{+3}$ has been shown to absorb a detectable amount of energy in the microwave frequency range. Float glass can comprise $Na_2O-CaO-MgO-SiO_2$, and the metal ions can be incorporated into the glass as about 1 wt. % $MnO_2$ or $Fe_2O_3$. Additionally, borosilicate glasses doped with Cu, Ni, Co, and Fe in high concentrations (greater than about 10%) exhibit detectable non-resonant microwave absorption at zero field. The energy absorption characteristics of these alternative host material/metal ion combinations at zero magnetic field have been known in the art, but never utilized as part of a memory device. Other examples of materials that could be engineered to contain transition metals that could be oxidized/reduced by applied potentials or light to exhibit zero field splitting memory behavior include porphyrins, ferrocenes, and perovskites.

Figure 4:
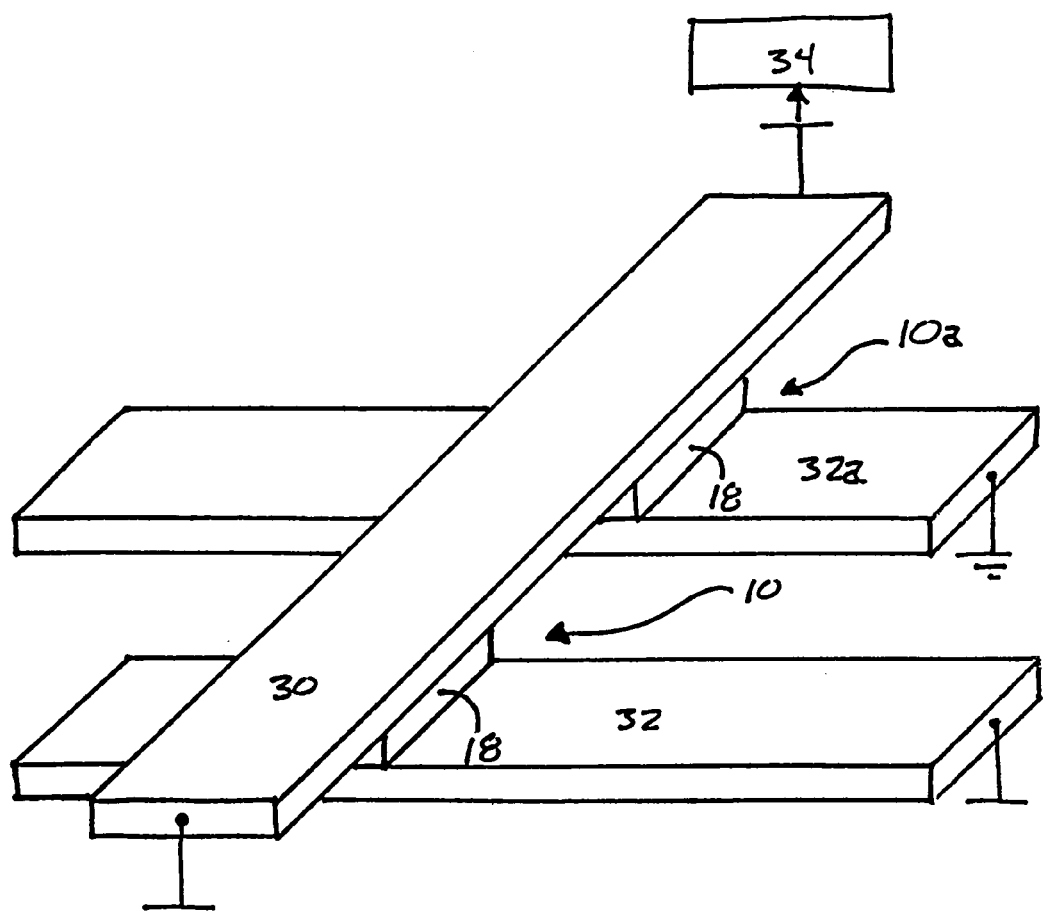
FIG. 4 is a representative portion of a memory array incorporating memory cells in accordance with the invention.

As shown in FIG. 4, the memory cells 10 of the invention can be utilized in a memory array by being formed between conductive intersecting column lines 30 and row lines 32. At each intersection is located the host material 18 comprising metal ions. When the host material 18 is of the appropriate composition (e.g., the correct matrix material supporting the correct ions and ligands), it can be written, read, and erased in a non-volatile manner for operation as a memory device as discussed herein.

A memory cell in accordance with an exemplary embodiment of the invention stores information as a stable energy absorption state; which is one of two states, the other being a stable non-energy-absorbing state. The energy absorbing property of the memory cell should be sufficient to absorb a detectable amount of an energy (e.g., electrical or optical) impulse at a bandwidth corresponding to the splitting at zero field of the ions in the host material. Energy, bandwidth frequency, and pulse rise time are interrelated variables relating to the programming of the memory cell. These variables are interrelated in general accordance with the following formulas:

$$\text{Bandwidth frequency (Hz)} \approx \frac{0.35}{\text{pulse rise time (seconds)}} \quad (1a)$$

$$\text{Energy (cm}^{-1}) \approx \frac{\text{Bandwidth frequency (Hz)}}{3 \times 10^{10} \text{ (cm/s)}} \quad (1b)$$

Although the two memory states of the memory cells of the invention have been described as an energy-absorbing state and a non-energy-absorbing state, the invention is not limited to such states. Two energy-absorbing states may also be used, where the amount of energy absorption each state exhibits is great enough for individual detection and also allows effective differentiation between the two states.

Writing (as well as erasing) the memory cells can be accomplished by three phenomena: (1) changing the oxidation state of the metal ions of the cell; (2) changing the ligand field environment of the metal ions; each induced either by using a voltage potential or light impulse; or (3) a combination of (1) and (2). Either of these inducement techniques can change the zero field splitting parameters of the metal ions in a host material 18.

The exemplary memory device of the invention can be written by a potential pulse as already discussed. For example, as shown in FIG. 4, a column line 30 is charged with a programming potential while an intersecting row line 32a is grounded. The memory cell 10a at the intersection of the column line 30 and row line 32a is then programmed (e.g., by redox reaction or ligand field change) to the stable energy-absorbing memory state from a stable non-energy-absorbing state.

The specific mechanism enabling the memory cell to switch between energy-absorbing and non-energy-absorbing states will vary depending upon the way the metal ion is altered. Examples include a change in oxidation state of the ions (e.g., $Mn^{+2}$) within the host material (e.g., $Ge_{40}Se_{60}$) or because of an alteration of the distribution of molecular species within the memory element of the device such that the metal ions are associated with a charged ligand field environment around the ion. Under the oxidation theory, the metal ions of the host material may form a redox pair, such as $Mn^{+2}/Mn^{+3}$, $Cu^{+2}/Cu^{+1}$, or $Fe^{+2}/Fe^{+3}$, which permits energy absorption within the cell. Under the altered ligand theory, the ligand field around the metal ions may undergo a structural change within the memory cell. For example, if a potential applied in a specific direction across the cell causes a rearrangement in the molecular matrix or if the metal ions redistribute non-homogeneously and see more spin-spin interactions (electrons interacting with each other) due to ion proximity, energy absorption can be enabled or disabled within the cell.

Because the memory cell's ability to store data is based on a changeable physical property of the cell, the memory cell can be non-volatile, or at least has very low volatility compared with prior art memory technologies such as DRAM. For example, if the programming mechanism is based on a redox reaction, once the potential applied across the cell generates a larger distribution of one redox state of the metal ions, removal of the potential does not initiate a reverse redox reaction. Likewise, a rearrangement of the molecular matrix remains until another input of energy changes the matrix.

After programming, the memory device can be returned to its original energy absorption state. One method of turning off programmed devices is by applying a reverse voltage potential relative to the programming potential of the stimulation pulse. Another method is by utilizing a light pulse.

The programmed state of the memory cell can be read, preferably, by sensing the absorption or transmission of energy from a read electrical pulse applied to the cell. After programming a cell to an energy-absorbing state, the metal ions of the cell have a zero field interaction, which results in the metal ions being able to absorb a detectable amount of energy corresponding to the splitting at zero field. If the pulse rise time corresponds to the separation in energy of the electron spin levels at zero field, the signal (or at least a detectable portion thereof) is absorbed by the memory cell and a reduced or absent energy transmission can be sensed by read circuitry. However, if no energy is absorbed because the cell is not programmed to an energy-absorbing state, the energy applied to the cell remains largely intact and can be sensed by read circuitry as corresponding to the non-programmed state of the cell.

The energy pulse rise time of the read signal is selected (in accordance with Equations (1a) and (1b)) so that a non-programmed cell does not affect the pulse, but a programmed cell absorbs at least a detectable amount of the transmitted energy. Pulse rise times are specific to the zero field splitting parameters of the molecular system. Pulse rise times in accordance with the exemplary embodiments of the invention (FIG. 2) described above should be about 380 picoseconds to less than 4 picoseconds in order to correspond to the separation in electron spin level energy at zero field of the metal ions used in the memory cells; $Mn^{+2}$, $Cu^{+2}$, and $Fe^{+2}$ being examples. The memory device's access speed is limited only by the speed of the access electronics.

A memory cell 10a can be addressed for reading by a read pulse input at the column line 30 (with row line 32a grounded). As the pulse propagates down the column line it is absorbed by the memory cell 10a host material 18 if: (1) the host material 18 is in a zero field splitting state; and (2) the row line 32a at the address is grounded. The memory cell 10a is read by sense circuitry 34 in electrical communication with the column line 30 according to the amount of the column line 30 pulse absorbed by the memory cell 10a.

In accordance with another embodiment of the invention, the memory cells 10 can be induced to change state by a light pulse. The light pulse may either make the cells permanently change state (e.g., to an energy-absorbing state) for a write-once device, or a second wavelength of light (or some other energy input) could reverse the state written by the first wavelength (e.g., to a non-energy-absorbing state), making for a non-volatile memory (e.g., random access memory). The light pulse can induce an oxidation state change in the memory cells 10. Physical changes in the glass matrix host material 18 system or molecular conformal changes may occur.

In another embodiment in accordance with the invention, the host material 18 incorporates multiple transition metal ion species (more than one ion type) to make a memory cell 10 having a multi-state zero field splitting resonance memory, which is capable of storing multiple bits. The basic structure of such a memory cell 10 can be like that shown in FIG. 2 and described above. However, where the host material 18 of the embodiment described in accordance with FIG. 2 is doped only with one metal ion species, the host material 18 of this embodiment incorporates at least two metal ion species, for example, one ion can be $Mn^{+2}$ and another can be $Cu^{+2}$. Both can be incorporated in a $Ge_{40}Se_{60}$ host material.

This embodiment is capable of multiple oxidation states or multiple configurations which have different zero field splitting parameters. Because each transition metal ion (e.g., ions of Mn, Ti, Co, Cr, Cu, Zn, Ni, Fe, Cd, V, and others) has a different zero field splitting energy in the matrix, each programmed state relating to the different ion types can be accessed for a reading operation using a different electrical energy pulse with a rise time corresponding to the energy splitting of a particular ion. For example, a pulse corresponding to a zero field splitting energy of 0.35 $cm^{-1}$ may be used to read a bit corresponding to $Mn^{+3}$ ions, but a pulse of greater or lesser magnitude and different rise time may be used for reading a bit stored by $Cu^{+2}$, where the latter pulse would have no effect on the bit stored by the $Mn^{+3}$ ion because rise times are coordinated with the different ion species. A single memory cell 10 can therefore contain a plurality of independent memory states, which can each be independently read by changing the rise time of the read pulse. As with other embodiments discussed above, the memory cells 10 of this embodiment can be programmed by either application of a light pulse of a certain wavelength or by application of a potential across the memory cell 10. The ions of different metal species may respond to a programming input with either an oxidation state change or a ligand field rearrangement, as discussed.

In this embodiment, it is possible that programming for an ion species with a higher potential programming needs could affect the programmed state of an ion species with lower potential programming needs. Therefore, there should be an order in programming through the various ion species types that takes this into consideration. It is also possible to use various combinations of electrical and light pulses to program the memory cells. The reading of memory states would be independent because pulse rise times used for reading the various ions of a memory cell would be specific to individual ion types and would have no effect on other ion types since these rise times can be correlated to the zero field splitting energy.

Figure 5:
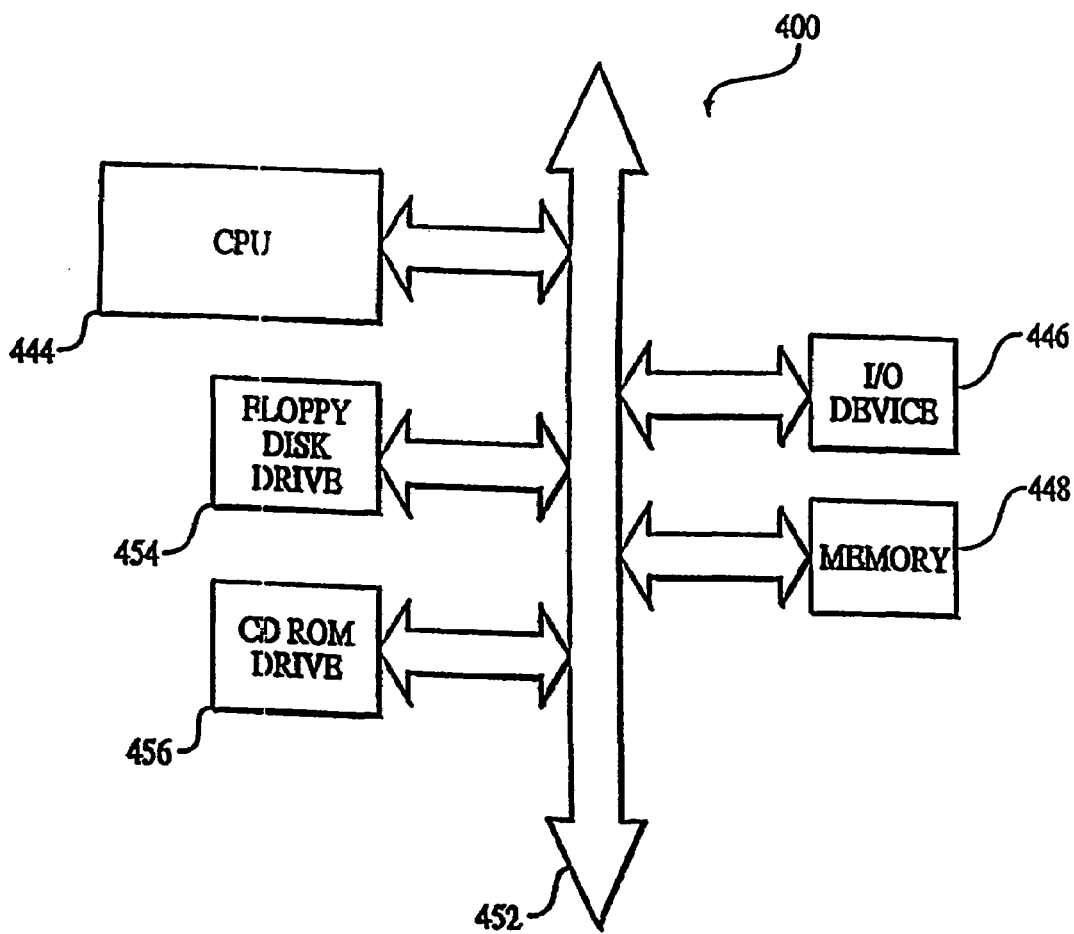
FIG. 5 is a representation of a processor system employing a memory device incorporating exemplary embodiments of memory cells in accordance with the invention.

FIG. 5 shows a typical processor-based system 400, which includes a memory circuit 448, for example, a programmable RAM, employing memory devices having memory cells 10 constructed in accordance with the invention. A processor system, such as computer system, generally comprises a central processing unit (CPU) 444, such as a microprocessor, a digital signal processor, or other programmable digital logic devices. Such devices communicate with an input/output (I/O) device 446 over a bus 452. The memory 448 communicates with the system over the bus 452, typically by a memory controller.

In the case of a computer system, the processor may include peripheral devices, such as a disk drive 454 and a CDROM drive 456, which also communicate with the CPU 444 over the bus 452. Memory 448 is preferably constructed as an integrated circuit, which includes one or more memory devices having memory cells 10. If desired, the memory 448 may be combined with the processor, for example CPU 444, in a single integrated circuit.

The processes and devices described above are merely illustrative of but a few of the preferred methods and devices that could be used and produced in accordance with the invention. The above description and drawings illustrate embodiments, which achieve the objects, features, and advantages of the invention. However, it is not intended that the invention be strictly limited to the above-described and illustrated embodiments. Any modifications of the invention that come within the spirit and scope of the following claims should be considered part of the invention.

What is claimed as new and desired to be protected by Letters Patent of the United States is:

The invention claimed is:

1. A memory cell, comprising:
   a host material layer, said host material layer exhibiting zero field splitting and being configured to store data as an energy-absorbing state and a lesser-energy-absorbing state; and
   a first electrode and a second electrode, each being electrically coupled to said host material layer.

2. The memory cell of claim 1, wherein said host material layer incorporates metal ions, said metal ions exhibiting said zero field splitting.

3. The memory cell of claim 1, wherein said lesser-energy-absorbing state is a non-energy-absorbing state.

4. The memory cell of claim 1, wherein said host material layer is organic.

5. The memory cell of claim 1, wherein said host material layer is a polymer.

6. The memory cell of claim 1, wherein said host material layer is inorganic.

7. The memory cell of claim 1, wherein said host material layer is a chalcogenide glass.

8. The memory cell of claim 1, wherein said host material layer is germanium selenide.

9. The memory cell of claim 8, wherein said germanium selenide is $Ge_{40}Se_{60}$.

10. The memory cell of claim 2, wherein said metal ions comprise ions of a metal selected from the group consisting of Co, Cr, Fe, Mn, Ti, Cu, Zn, V, Cd, and Ni.

11. The memory cell of claim 2, wherein said metal ions comprise $Mn^{+2}$.

12. The memory cell of claim 1, wherein said host material layer is $Ge_{40}Se_{60}$ that incorporates about 3 wt. % $Mn^{+2}$ as metal ions.

13. The memory cell of claim 2, wherein said host material layer and said metal ions are configured to absorb a detectable amount of energy corresponding to a separation in electron spin level energy of said metal ions at zero field.

14. The memory cell of claim 2, wherein said host material layer and said metal ions are configured to absorb about 0.03 cm$^{-1}$ to about 3.3 cm$^{-1}$ when said memory device is programmed to said energy-absorbing state.

15. The memory cell of claim 2, wherein said hose material layer and said metal ions are configured to absorb about 0.33 cm$^{-1}$ when said memory device is programmed to said energy-absorbing state.

16. The memory cell of claim 1, wherein one of said first and second electrodes is manganese and the other is tungsten.

17. The memory cell of claim 1, wherein said device is configured to be programmed to said energy-absorbing state by a light pulse.

18. The memory cell of claim 1, wherein said device is configured to be programmed to said energy-absorbing state by an electrical pulse.

19. A zero-field splitting memory device, comprising:
a first electrode;
a germanium selenide layer in contact with said first electrode, said germanium selenide layer having a stoichiometry of Ge$_x$Se$_{100-x}$;
metal ions incorporated into said germanium selenide layer, wherein said germanium selenide and said metal ions are configured to absorb a detectable amount of energy when said memory device is programmed to an energy-absorbing state; and
a second electrode in contact with said germanium selenide layer.

20. The zero-field splitting memory device of claim 19, wherein said first electrode, said germanium selenide layer, and said second electrode are vertically stacked.

21. The zero-field splitting memory device of claim 19, wherein said germanium selenide is Ge$_{40}$Se$_{60}$ and said metal ions comprise Mn$^{+2}$.

22. The zero-field splitting memory device of claim 21, wherein said Ge$_{40}$Se$_{60}$ incorporates about 3 wt. % Mn$^{+2}$.

23. The zero-field splitting memory device of claim 22, wherein said detectable amount of energy is about 0.03 cm$^{-1}$ to about 3.3 cm$^{-1}$.

24. The zero-field splitting memory device of claim 19, wherein said germanium selenide layer is about 100 Å to about 2,000 Å in thickness.

25. The zero-field splitting memory device of claim 19, wherein said metal ions comprise ions of a metal selected from the group consisting of Co, Cr, Fe, Mn, Ti, Cu, Zn, Ni, V, Cd, and combinations thereof.

26. The zero-field splitting memory device of claim 19, wherein said device comprises a plurality of memory cells each comprising a respective said first electrode, said germanium selenide layer, and said second electrode.

27. A multiple-bit memory device, comprising:
a host material incorporating a plurality of different metal ion types, said each of said different metal ion types exhibiting zero field splitting, said host material and said different metal ion types being configured to store data as a plurality of energy-absorbing states and a non-energy-absorbing state; and
a first electrode and a second electrode, each being electrically coupled to said host material.

28. The multiple-bit memory device of claim 27, wherein said first electrode, said host material, and said second electrode are stacked vertically.

29. The multiple-bit memory device of claim 27, wherein said host material is organic.

30. The multiple-bit memory device of claim 27, wherein said host material is a polymer.

31. The multiple-bit memory device of claim 27, wherein said host material is inorganic.

32. The multiple-bit memory device of claim 27, wherein said host material is a chalcogenide glass.

33. The multiple-bit memory device of claim 27, wherein said host material is germanium selenide.

34. The multiple-bit memory device of claim 33, wherein said germanium selenide is Ge$_{40}$Se$_{60}$.

35. The multiple-bit memory device of claim 27, wherein said plurality of different metal ion types comprise ions of at least two metal species selected from the group consisting of Co, Cr, Fe, Mn, Ti, Cu, Zn, V, Cd, and Ni.

36. The multiple-bit memory device of claim 27, wherein said plurality of different metal ion types comprise Mn$^{+3}$.

37. The multiple-bit memory device of claim 27, wherein said host material is Ge$_{40}$Se$_{60}$ incorporating Mn$^{+2}$ and Cu$^{+2}$ as said plurality of different metal ion types.

38. The multiple-bit memory device of claim 27, wherein said host material and said plurality of different metal ion types are configured to absorb a detectable amount of energy corresponding to a separation in energy of the electron spin levels of each of said plurality of different metal ion types at zero field.

39. The multiple-bit memory device of claim 27, wherein said host material and said metal ions are configured to absorb about 0.03 cm$^{-1}$ to about 3.3 cm$^{-1}$ when said memory device is programmed to one of said plurality of energy-absorbing states and a different amount of energy at a different one of said plurality of energy-absorbing states.

40. The multiple-bit memory device of claim 27, wherein said device is configured to be programmed to said plurality of energy-absorbing states by light pulses.

41. The multiple-bit memory device of claim 27, wherein said device is configured to be programmed to said plurality of energy-absorbing states by electrical pulses.

42. A processor-based device, comprising:
a processor; and
a memory cell, comprising:
a host material incorporating metal ions, said metal ions exhibiting zero field splitting and said host material being configured to store data as an energy-absorbing state and a non-energy-absorbing state; and
a first electrode and a second electrode, each being electrically coupled to said host material.

43. The processor-based device of claim 42, wherein said metal ions comprise Mn$^{+2}$.

44. The processor-based device of claim 42, wherein said host material is Ge$_{40}$Se$_{60}$ incorporating about 3 wt. % Mn$^{+2}$ as said metal ions.

45. The processor-based device of claim 42, wherein said host material and said metal ions are configured to absorb a detectable amount of energy corresponding to a separation in the electron spin level energy of said metal ions at zero field.

46. The processor-based device of claim 42, wherein said host material and one of said plurality of different metal ion types are configured to absorb about 0.03 cm$^{-1}$ to about 3.3 cm$^{-1}$ when said memory device is programmed to said energy-absorbing state.

47. A method of operating a memory device, comprising:
providing a memory device comprising a host material which incorporates metal ions exhibiting zero field splitting;

programming said memory device to an energy-absorbing state corresponding to a separation of spin states of said metal ions at zero magnetic field; and reading said memory device by sensing the absorption or transmission of a read energy pulse through said host material.

48. The method of claim 47, wherein said host material comprises an organic ligand.

49. The method of claim 47, wherein said host material comprises a polymer.

50. The method of claim 47, wherein said host material comprises an inorganic ligand.

51. The method of claim 47, wherein said host material comprises a chalcogenide glass.

52. The method of claim 47, wherein said host material comprises germanium selenide.

53. The method of claim 47, wherein said host material comprises $Ge_{40}Se_{60}$ glass.

54. The method of claim 47, wherein said metal ions comprise ions of a metal selected from the group consisting of Go, Cr, Fe, Mn, Ti, Cu, Zn, Ni, V, Cd, and combinations thereof.

55. The method of claim 47, wherein said metal ions comprise $Mn_{+2}$.

56. The method of claim 47, wherein said programming said memory device comprises applying a write voltage to said host material.

57. The method of claim 47, wherein said programming said memory device comprises applying a light pulse to said host material.

58. The method of claim 47, wherein said reading said memory device comprises applying energy to said host material without changing the programming of said memory device.

59. The method of claim 47, wherein said reading said memory device comprises applying energy to said host material in the microwave frequency range.

60. The method of claim 47, wherein said reading said memory device comprises applying an energy pulse to said host material of at least about $0.03\ cm_{-1}$.

61. The method of claim 47, further comprising programming said memory device to a non-energy-absorbing state after reading.

62. A method of operating a multiple-bit memory cell, comprising:

providing a memory cell comprising a host material which incorporates a plurality of metal ion species, each said species exhibiting zero field splitting;

programming said memory cell to at least one of a plurality of energy-absorbing states, each said energy-absorbing state corresponding to a separation of spin states of a respective one of said plurality of metal ion species at zero magnetic field; and reading said memory device by sensing the absorption or transmission of one of a plurality of read energy pulses through said host material, said one read energy pulse corresponding to said respective one metal ion species.

63. The method of claim 62, wherein said host material comprises an organic ligand.

64. The method of claim 62, wherein said host material comprises a polymer.

65. The method of claim 62, wherein said host material comprises an inorganic ligand.

66. The method of claim 62, wherein said host material comprises a chalcogenide glass.

67. The method of claim 62, wherein said host material comprises germanium selenide.

68. The method of claim 62, wherein said host material comprises $Ge_{40}Se_{60}$ glass.

69. The method of claim 62, wherein said plurality of metal ion species comprises ions of at least two metals selected from the group consisting of Co, Cr, Fe, Mn, Ti, Cu, Zn, V, Cd, and Ni.

70. The method of claim 62, wherein said respective one metal ion species is $Mn^{+2}$.

71. The method of claim 62, wherein a second respective metal ion species is $Cu^{+2}$.

72. The method of claim 62, wherein said programming said memory cell comprises applying a write voltage to said host material.

73. The method of claim 62, wherein said programming said memory cell comprises applying a light pulse to said host material.

74. The method of claim 62, wherein said reading said memory cell comprises applying energy to said host material without changing the programming of said memory device.

75. The method of claim 62, wherein said reading said memory cell comprises applying energy to said host material in the microwave frequency range.

76. The method of claim 62, wherein said reading said memory cell comprises applying an energy pulse to said host material of at least about $0.03\ cm^{-1}$ for said respective one metal ion species.

77. The method of claim 62, further comprising programming said memory cell to a non-energy-absorbing state after reading.

* * * * *

UNITED STATES PATENT AND TRADEMARK OFFICE
CERTIFICATE OF CORRECTION

PATENT NO.       : 7,105,864 B2
APPLICATION NO.  : 10/765911
DATED            : September 12, 2006
INVENTOR(S)      : Kristy A. Campbell et al.

It is certified that error appears in the above-identified patent and that said Letters Patent is hereby corrected as shown below:

In the Claims:

Claim 54, column 11, line 21, "Go" should read --Co--;

Claim 55, column 11, line 24, "$Mn_{+2}$" should read --$Mn^{+2}$--; and

Claim 60, column 11, line 40, "$cm_{-1}$" should read --$cm^{-1}$--.

Signed and Sealed this

Nineteenth Day of December, 2006

JON W. DUDAS
*Director of the United States Patent and Trademark Office*